United States Patent [19]

Mo

[11] Patent Number: 4,933,303
[45] Date of Patent: Jun. 12, 1990

[54] METHOD OF MAKING SELF-ALIGNED TUNGSTEN INTERCONNECTION IN AN INTEGRATED CIRCUIT

[75] Inventor: Roy Mo, Flushing, N.Y.
[73] Assignee: Standard Microsystems Corporation, Hauppauge, N.Y.
[21] Appl. No.: 384,974
[22] Filed: Jul. 25, 1989
[51] Int. Cl.$^5$ .................... H01L 21/44; H01L 21/48
[52] U.S. Cl. .................... 437/190; 437/189; 437/192; 437/195; 437/944
[58] Field of Search ............... 437/190, 192, 195, 244; 357/715

[56] References Cited

U.S. PATENT DOCUMENTS

| | | | |
|---|---|---|---|
| 4,283,439 | 8/1981 | Higashinakagawa et al. | 437/192 |
| 4,582,563 | 4/1986 | Hazuki et al. | 437/192 |
| 4,822,749 | 4/1989 | Flanner et al. | 437/192 |

Primary Examiner—Brian E. Hearn
Assistant Examiner—Laura Holtzman
Attorney, Agent, or Firm—Hopgood, Calimafde, Kalil, Blaustein & Judlowe

[57] ABSTRACT

A process is disclosed for making a self-aligned metal (preferably tungsten) connection in an integrated circuit. A contact hole formed in a first dielectric layer on a substrate is filled with metal, after which the first dielectric layer and the metal-filled contact hole are covered with a second dielectric layer. A photoresist layer is formed over the second dielectric layer and is patterned. A trench is formed in the exposed second dielectric layer and a thin layer of silicon or a metal such as tungsten is then sputtered or evaporated to form a layer of the silicon or metal on the upper surface of the patterned photoresist and the bottom and side walls of the trench. The patterned photoresist is removed and the trench is filled with metal.

3 Claims, 4 Drawing Sheets

METHOD OF MAKING SELF-ALIGNED TUNGSTEN INTERCONNECTION IN AN INTEGRATED CIRCUIT

BACKGROUND OF THE INVENTION

The present invention relates generally to the fabrication of semiconductor integrated circuits, and more particularly to the fabrication of very large-scale integration (VLSI) circuits.

Recent developments in MOS VLSI integrated circuits have resulted in integrated circuits capable of operating at higher speeds and characterized by reduced-size geometries and greater packing densities. This trend toward increasingly complex MOS devices has pushed the limits of existing materials and fabrication processes. As the geometries of MOS devices have shrunk to one micron and even less, circuit densities have increased, contact holes have become smaller, and line widths have become narrower. The 15 resistance of the MOS devices fabricated in these integrated circuits has tended to increase, which increases RC time constants and thereby limits the overall speed of the MOS devices. Much effort has been directed to achieving lower resistances of the MOS device structures in an attempt to obtain higher device operating speeds.

One proposed solution to this problem has been the use of refractory metal, such as tungsten, and their silicides, as a high-conductive, low-resistance interconnect material. The use of these materials provides an alternate to polysilicon for first-level interconnections and gate electrodes and an alternate to aluminum for multilevel interconnects, and a way of planarizing contacts and via holes without the need for troublesome sloped contact etching.

As device dimensions are scaled and the number of devices per chip increases, there is also a need for additional levels of interconnection. Double metal processes are now practiced widely, three-layer processes are used occasionally, and four-layer processes are under development. One of the main factors limiting the advance of VLSI multilevel interconnection is the topography on the wafer. Present process research is aimed at circumventing or eliminating the problems associated with wafer topography. A certain amount of planarization is required to overcome the topography created by the underlying structures. The achievement of desired planarization, however, typically requires precise process control, increased process complexity, and a reduction in product yield.

In a conventional process used to fabricate a multilevel MOS integrated circuit, a dielectric layer is deposited on a surface of a substrate, a contact hole is formed in the dielectric, and a first metal layer is deposited and then etched. A second dielectric layer (interdielectric) is then deposited over the metal and a photoresist layer is deposited over the second dielectric layer. The structure is then subjected to a blanket etch back in an attempt to achieve planarization of the interdielectric. A via hole is then formed in the interdielectric to the upper level of the first metal layer. Thereafter, a passivation layer is deposited and etched.

There are, however, numerous problems associated with this conventional multilevel process, such as severe topography resulting in metal step coverage problems and residual metal problems, which may cause electrical opens for the interconnects and intra level electrical shorts between adjacent interconnects. Other drawbacks associated with this conventional process include electromigration on narrow interconnects (particularly when aluminum is used), and the need for a metal overlap around the via and contact holes (dog-bone structure), which results in the reduction of device packing density and in a degraded circuit performance.

Two approaches for dealing with these problems have been described by the present inventor in application Ser. No. 107,573, now U.S. Pat. No. 4,764,484, and in pending application Ser. No. 107,487, both of which have been assigned to the assignee of the present application. Common to the processes described in these prior patent applications is the use of a blanket layer of silicon film to separate the upper and lower dielectric layers. Although these prior processes are useful in fabricating high-density VLSI circuits with improved topography, the silicon film utilized in these processes, if not well controlled during its deposition, may become contaminated.

One possible form of contamination of the silicon film is the formation of clusters of particles in the silicon film. If those particles become located between two metal lines, they could cause a short circuit between those metal lines. The present invention provides a process in which there is no continuous connection of silicon from one metal line to another metal line, thereby preventing the formation of undesired electrical shorts between adjacent unconnected metal lines.

It is accordingly a general object of the present invention to provide a process for fabricating interconnects in an MOS integrated circuit in which planarization of the interdielectric and metal etching, which are typically required in the fabrication of VLSI devices, are eliminated.

It is a further object of the present invention to provide a process for fabricating more reliable VLSI devices with higher densities.

It is another object of the present invention to provide a process of the type described in which the creation of shorts from one metal line to another is eliminated.

To these ends, in the process of the present invention, a contact hole formed in a first dielectric layer on a substrate is filled with metal, after which the first dielectric layer and the metal-filled contact hole are covered with a second dielectric layer. A photoresist layer is then coated over the second dielectric layer and is subjected to photolithography to pattern the photoresist. A trench is formed in the exposed second dielectric layer and a thin layer of silicon or a metal such as tungsten is then sputter deposited or evaporated to form a layer of the silicon or metal as the case may be on the upper surface of the photoresist and the bottom and side walls of the trench. The patterned photoresist is then removed, as by a lift-off process, and the trench is filled with metal, which consumes the silicon or metal previously deposited on the bottom and side walls of the trench.

BRIEF DESCRIPTION OF THE DRAWINGS

To the accomplishment of the above and to such other objects as may hereinafter appear, the present invention relates to a process for fabricating a VLSI MOS integrated circuit, substantially as defined in the appended claims and as described in the following specification, taken together with the accompanying drawings in which:

DESCRIPTION OF THE PREFERRED EMBODIMENT

Figure 1:
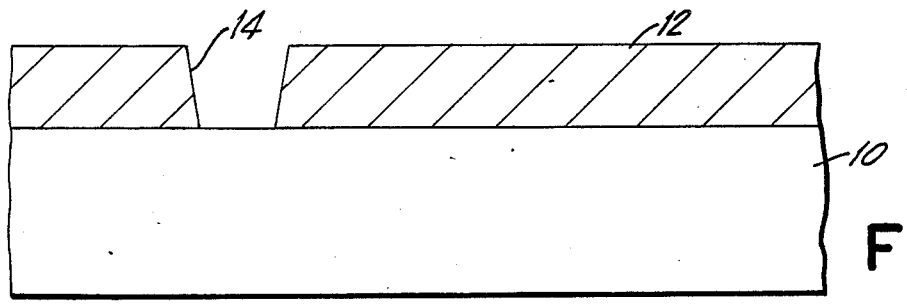
FIGS. 1–8 are cross-sectional views of a VLSI integrated circuit shown during various stages of its fabrication in accordance with the process of the invention, FIG. 8 illustrating the completed integrated circuit structure.

Referring to FIG. 1, there is shown a semiconductor integrated circuit subsequent to the completion of the front end of the process in which MOS devices forming an integrated circuit are formed in a silicon substrate 10. In accordance with the process of the present invention, which occurs during the back end of the integrated circuit fabrication, a dielectric layer 12, of, for example, silicon dioxide, and of a thickness between 0.3 and 2.5 microns is deposited on the upper surface of substrate 10. A contact window or contact hole 14 is formed in dielectric layer 12 and extends to the upper surface of the substrate. A metal 16, such as tungsten, is then deposited, such as by a conventional chemical vapor deposition (CVD) process, to fill the contact hole 14. At this time, as seen in FIG. 1, the upper surface of dielectric layer 12 is free of metal.

Figure 2:
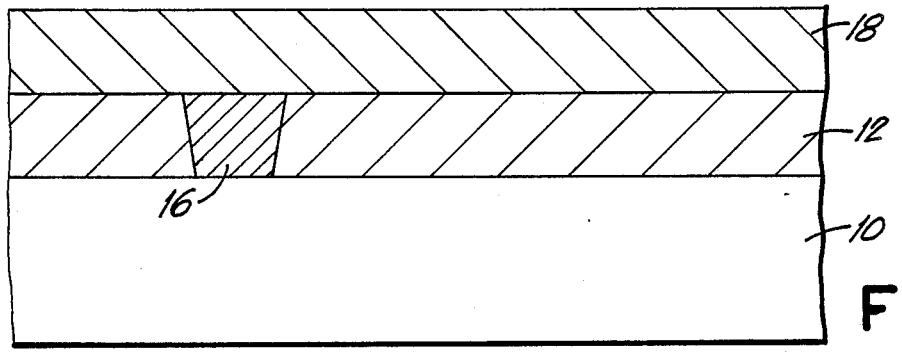

Thereafter, as illustrated in FIG. 2, a second dielectric layer 18 of, for example, silicon dioxide, is deposited over dielectric layer 12 and the metal-filled contact hole 14, 16. The thickness of the second dielectric layer 18 is preferably between 0.3 and 2.5 micron and is substantially equal to that of the interconnects.

Next, a photoresist system is deposited over the upper surface of the second dielectric layer 18. The photoresist system 20 is preferably one of the known multilayer sandwich construction consisting of a metal or an inorganic material as the middle layer to enhance etch selectivity of the image reversal process. A suitable multilayer photoresist for use in the image reversal process of the present invention would be one consisting of Shipley AZ 5200.

Figure 3:
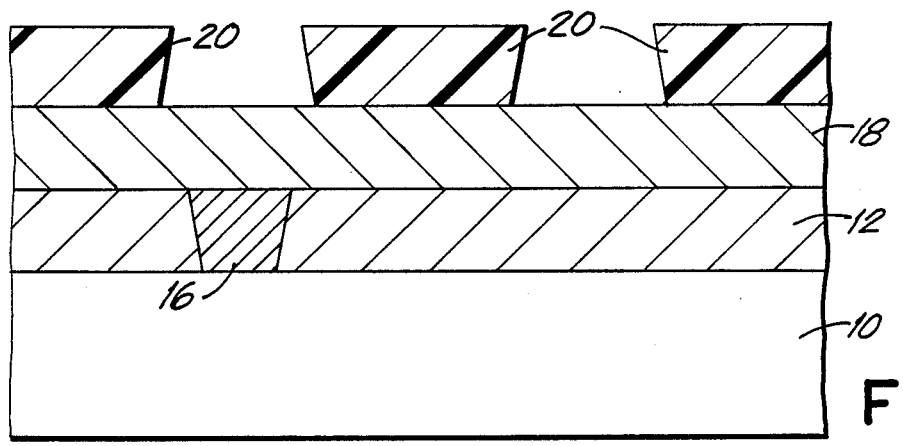
Figure 4:
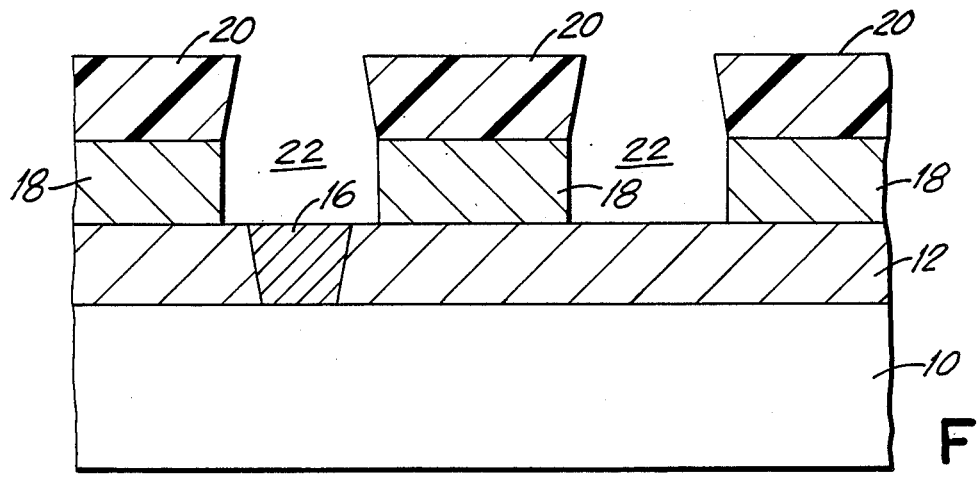

The photoresist system is then subjected to an image reversal process followed by a lift-off process after the photoresist is developed and the image is formed to produce, as shown in FIG. 4, regions of patterned photoresist 20 having the shape of inverted trapezoids with wider bases at their upper surfaces as compared to their lower surfaces. The details of the image reversal and lift-off processes are not in themselves novel and are described, for example, in Jones, S. K., Chapman, R. C., "Image Reversal" A Practical Approach to Lift-Off," SPIE Proceeding, Vol. 771, Advances in Resist Technology and Processing IV (1987), p. 231; Moritz, H. "Optical Single Layer Lift-Off Process", IEEE Transactions on Electron Devices, Vol. Ed-32, No. 3, 1985, p.672; Long, M. L., Newman J., "Image Reversal Techniques With Standard Positive Photoresist", SPIE Proceeding, Vol. 469, Advances in Resist Technology (1984), p. 189. The various steps in these processes, which typically may include positive resist coating, soft baking, pattern exposure, flood exposure, reverse baking, image development, and then another baking before metal deposition, are known in the prior art and are thus not described in any greater detail in this specification The structure of FIG. 3 is then subjected to either a plasma or reactive-ion etch (RIE) to etch through a part of the exposed second dielectric layer 18 to form metal trenches 22 in dielectric layer 18, as shown in FIG. 4. The upper 15 surface of the tungsten 16 filling the contact hole 14 may provide the signal to terminate this etching operation. Alternatively, the etch through the second dielectric layer may be time-controlled to terminate at the upper surface of the tungsten-filled contact hole.

Figure 5:
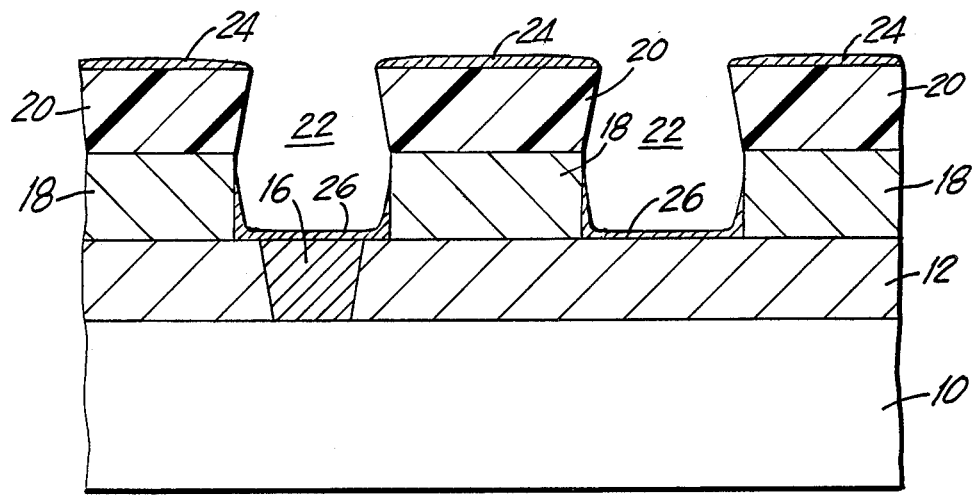

Thereafter, as shown in FIG. 5, a thin layer of silicon or tungsten is sputtered or evaporated onto the structure of FIG. 4. As a result of the inverted wedge shape or "lift-off" structure of the patterned photoresist regions 20, and the shadowing effect of the sputtering characteristics, the silicon or metal is formed only on the upper surface of the photoresist region 20, as at 24, at the bottom of the trenches 22, as at 26, and extending up along the sidewalls of the trenches 22. Significantly, because of the outwardly sloping sidewalls of the patterned photoresist regions 20, as shown in FIG. 5, none of the evaporated or sputtered silicon or metal adheres to the patterned photoresist side walls, thereby forming a discontinuity in the silicon or tungsten film at the vertical sidewalls of the trench 22.

Figure 6:
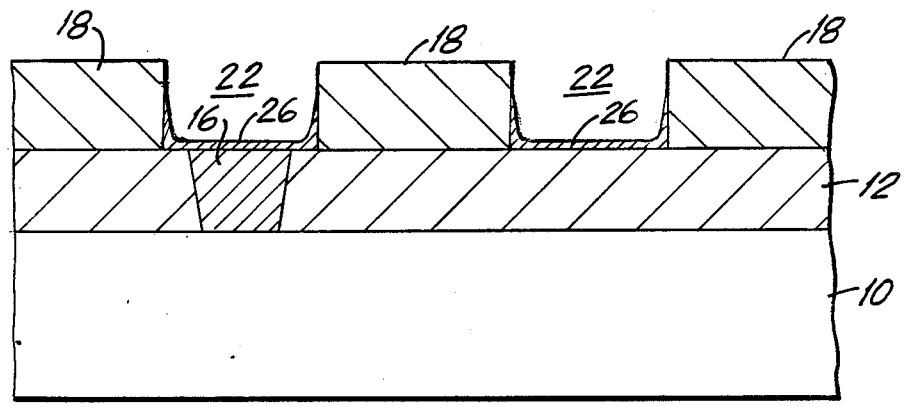

In the next step in the process, the photoresist regions 20 with the overlying silicon or tungsten film 24 are removed or stripped by the use of wet chemicals, such as chromic acid. Had there been silicon or tungsten film on the vertical sidewalls of the photoresist regions 20, those photoresist regions could not be removed by a chemical removal process. The resulting structure, illustrated in FIG. 6, includes a silicon or tungsten layer 26 lining the walls of the trenches 22, and overlying the tungsten 16 in the contact hole 14.

Following this step, a metal, such as tungsten, is deposited, such as by a chemical vapor deposition (CVD) process, to fill the metal trenches 22 wherever exposed silicon or tungsten 26 is present on the bottom surface and to a certain extent along the trench sidewalls, thereby to fill the trenches with metal as shown at 28. During this process, the thin layer of silicon 26 over the metal (tungsten) 16 is completely consumed to form metal (tungsten) 28 in direct physical and electrical contact with metal (tungsten) 16 in the underlying contact hole. This will ensure the absence of any interfacial resistance between the two tungsten interconnect levels 28 and 16.

Figure 7:
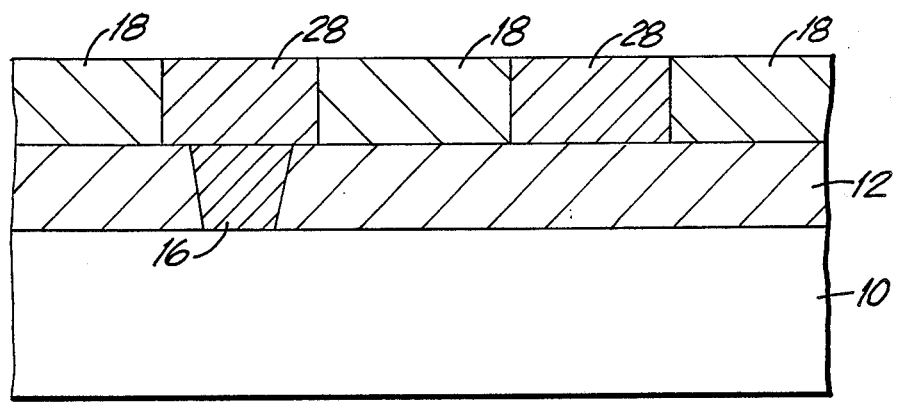
Figure 8:
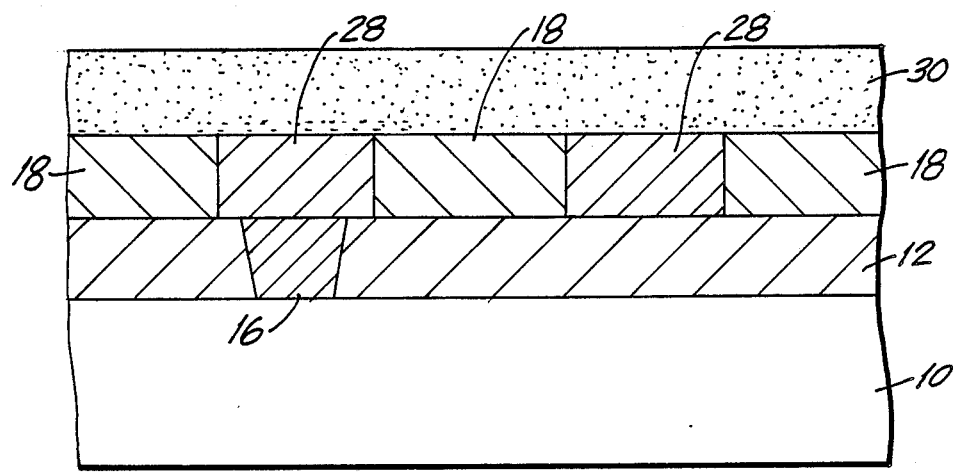

To complete the structure for a single-level metal process, as in FIG. 8, a passivation layer 30 is deposited and patterned over the structure of FIG. 7.

Figure 9:
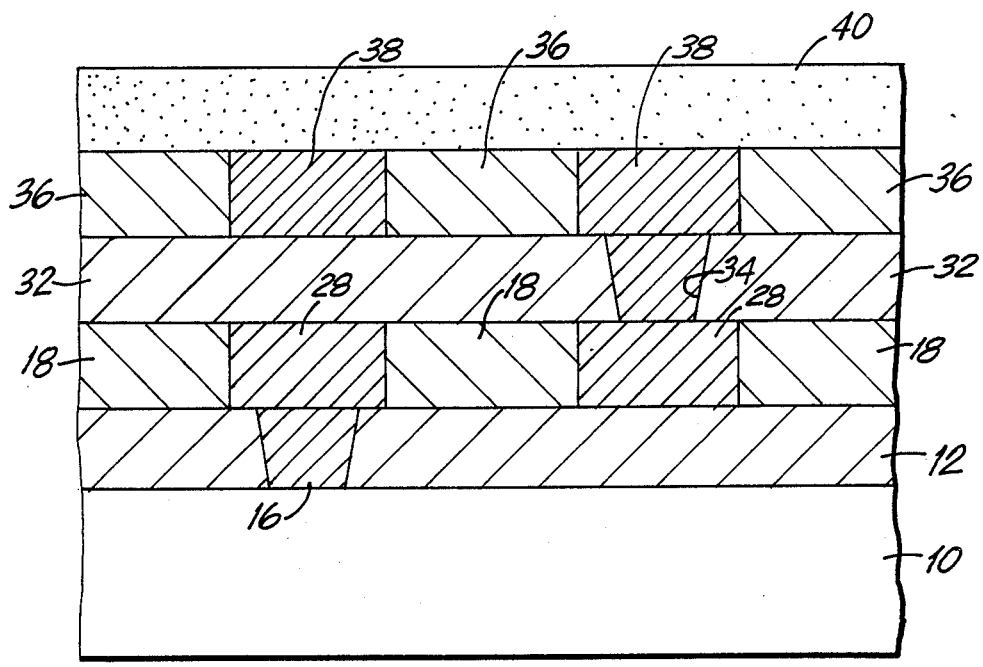
FIG. 9 is a cross-sectional view similar to FIG. 8 illustrating a multilevel integrated circuit fabricated according to the process of the invention.

If it is desired to fabricate a multilevel metal structure, as shown in FIG. 9, the process illustrated in FIGS. 1–8 is carried out after which a third dielectric layer 32 is deposited. A contact opening formed in layer 32 is filled with a metal (e.g., tungsten) 34 in electrical contact with the underlying metal-filled trench 28, after which a fourth dielectric layer 36 is deposited. As described above, with respect to FIGS. 3–7, metal trenches are formed in dielectric layer 36 and are filled with a metal (e.g., tungsten) 38 in electrical contact with the underlying metal-filled contact hole 34. A passivation layer 40 is then deposited and patterned to complete the fabrication of the multilevel structure of FIG. 9.

It will be appreciated that the steps illustrated in FIGS. 1–7 may be repeated as many times as desired to form structures of a greater number of interconnect levels. It will also be appreciated that the process of the invention satisfies the objects set forth earlier in this application. More specifically, the process eliminates two complex and difficult operations typically required in the fabrication at high-density VLSI devices, namely, the planarization of the interdielectric and metal etching. The conformal metallization achieved by the process of the invention thus provides more reliable VLSI devices. Moreover, the self-aligned metallization achieved by the process allows higher packing densities since it is no longer required to provide metal overlapping the contact and via holes.

It will also be appreciated that modifications may be made to the processes specifically described hereinabove without necessarily departing from the spirit and scope of the invention.

What is claimed is:

1. A process for fabricating an integrated circuit comprising the steps of forming a first dielectric layer on a major surface of a substrate, forming a contact hole in said first dielectric layer extending substantially to said major surface of said substrate, filling said contact hole with a first metal, depositing a second dielectric layer over said first dielectric layer and said metal-filled contact hole, patterning a photoresist layer over said second dielectric layer, forming an opening in said dielectric layer in communication with said metal-filled contact hole and with at least one opening patterned in said photoresist layer, depositing or sputtering silicon or a second metal onto said metal-filled contact hole and in part along the sidewalls of said opening in said second dielectric layer but not along the sidewalls of said patterned photoresist layer, removing said patterned photoresist layer, and depositing a third metal into said opening in said dielectric layer in electrical contact with said first metal in said contact hole.

2. The process of claim 1, in which said first, second and third metals are each tungsten.

3. The process of claim 1, in which said patterning of said photoresist layer comprises an image reversal process followed by a lift-off process.

* * * * *